(12) United States Patent
Moriwaka

(10) Patent No.: US 7,851,352 B2
(45) Date of Patent: Dec. 14, 2010

(54) MANUFACTURING METHOD OF SEMICONDUCTOR DEVICE AND ELECTRONIC DEVICE

(75) Inventor: Tomoaki Moriwaka, Kanagawa (JP)

(73) Assignee: Semiconductor Energy Laboratory Co., Ltd, Kanagawa-Ken (JP)

( * ) Notice: Subject to any disclaimer, the term of this patent is extended or adjusted under 35 U.S.C. 154(b) by 23 days.

(21) Appl. No.: 12/110,986

(22) Filed: Apr. 28, 2008

(65) Prior Publication Data
US 2008/0280402 A1    Nov. 13, 2008

(30) Foreign Application Priority Data
May 11, 2007    (JP)    ............... 2007-127081

(51) Int. Cl.
*H01L 21/4763* (2006.01)
*H01L 21/02* (2006.01)
(52) U.S. Cl. ............... 438/630; 438/164; 438/149; 438/651; 438/682; 257/E21.199; 257/E21.438; 257/E21.619; 257/382
(58) Field of Classification Search .......... 438/682, 438/164, 149, 630, 651; 257/E21.619
See application file for complete search history.

(56) References Cited
U.S. PATENT DOCUMENTS

| | | | |
|---|---|---|---|
| 5,236,865 A | 8/1993 | Sandhu et al. | |
| 6,309,917 B1 | 10/2001 | Furuta et al. | |
| 6,335,253 B1 | 1/2002 | Chong et al. | |
| 6,420,760 B2 | 7/2002 | Furuta et al. | |
| 6,743,687 B1 | 6/2004 | Yu | |
| 6,770,508 B2 | 8/2004 | Nakashima et al. | |
| 7,256,112 B2 | 8/2007 | Chong et al. | |
| 7,288,480 B2 | 10/2007 | Yamaguchi et al. | |
| 2002/0115242 A1* | 8/2002 | Joo et al. | 438/149 |
| 2004/0135143 A1* | 7/2004 | Harano et al. | 257/57 |
| 2007/0161161 A1* | 7/2007 | Chang et al. | 438/149 |

FOREIGN PATENT DOCUMENTS

| | | |
|---|---|---|
| JP | 2000-277750 | 10/2000 |
| JP | 2000-323713 | 11/2000 |

* cited by examiner

*Primary Examiner*—Ha Tran T Nguyen
*Assistant Examiner*—Aaron A Dehne
(74) *Attorney, Agent, or Firm*—Nixon Peabody LLP; Jeffrey L. Costellia

(57) ABSTRACT

Silicide films with high quality are formed with treatment of laser light irradiation, so that miniaturization and higher performance is achieved in a field-effect transistor that is formed over an insulating substrate and has little variation in electric characteristics. An island-shaped semiconductor film including a pair of impurity regions and a channel formation region is formed over an insulating substrate, a first metal film is formed on the pair of impurity regions, and a second metal film that functions as a reflective film is formed over a gate electrode located over the channel formation region with a gate insulating film interposed therebetween. The first metal film is irradiated with laser light and a region where the second metal film is formed reflects the laser light, so that the island-shaped semiconductor film and the first metal film selectively react with each other in the pair of impurity regions.

18 Claims, 13 Drawing Sheets

FIG. 13A
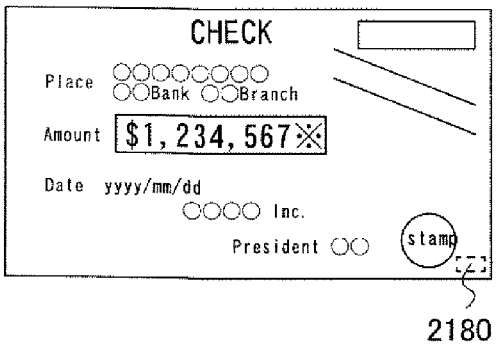
2180
FIG. 13B
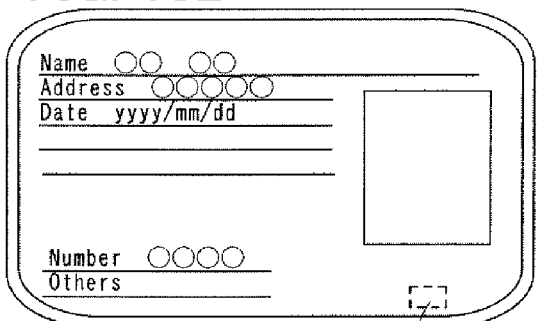
2180
FIG. 13C
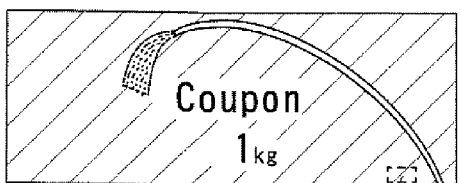
2180
FIG. 13D
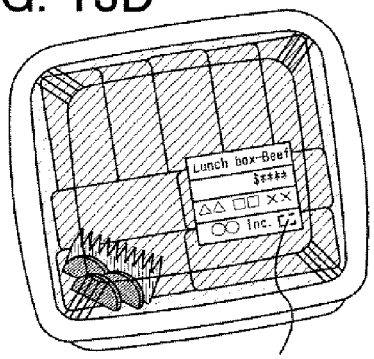
2180
FIG. 13E
2180
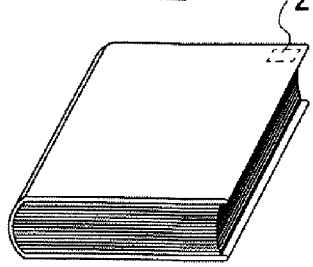
FIG. 13F
2180
FIG. 13G
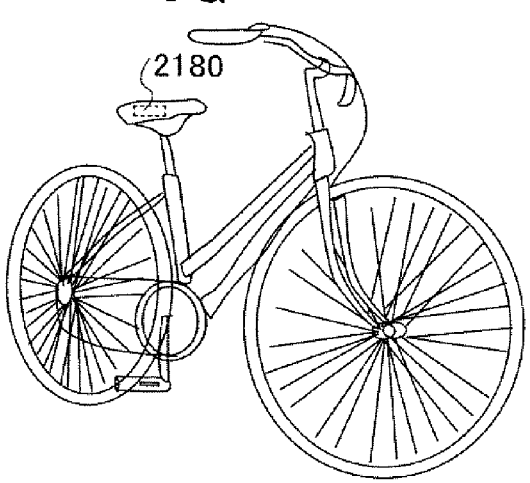
2180
FIG. 13H
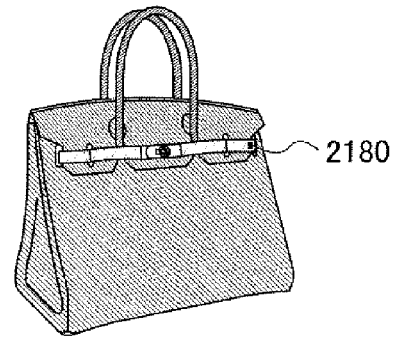
2180

MANUFACTURING METHOD OF SEMICONDUCTOR DEVICE AND ELECTRONIC DEVICE

BACKGROUND OF THE INVENTION

1. Field of the Invention

The present invention relates to a method for manufacturing a semiconductor device, and to an electronic device having the semiconductor device.

2. Description of the Related Art

With high integration of large scale integration (LSI), miniaturization of each element (e.g., transistors) constituting LSI is required. As the size of elements is reduced to miniaturize transistors, a problem called "short channel effect" stands out. A short channel effect results in a drop in threshold voltage or an increase in leakage current, so that unfortunately, reliability of the elements declines.

As measures to suppress the short channel effect, thinning of a semiconductor film which functions as an active layer and a gate insulating film has been under consideration. If a semiconductor film and a gate insulating film are thinned, low contact resistance is required between a metal wiring and the semiconductor film or in an impurity region of the semiconductor film. Therefore, a technique to lower contact resistance or resistance of an impurity region (a source region and a drain region) by forming a silicide film in a semiconductor film has been employed in the semiconductor field. With low resistance in a semiconductor film, an on-current is increased in a semiconductor device, and thus a semiconductor device with excellent characteristics can be manufactured.

In order to silicide a semiconductor film, a method is generally taken in which a metal film is formed on a semiconductor film and heat treatment is performed to make the films react with each other, so that a silicide film is formed at an interface between the semiconductor film and the metal film. However, a thermal process has a problem in that a degree of freedom of selecting a substrate is lowered depending on the heat resistance of the substrate. Further, it is difficult to form a silicide film with high quality by heat treatment at a low temperature (e.g., 450 to 750° C.). In view of the above problem, a technique is attempted in which laser light irradiation is performed with a semiconductor film and a metal film in contact with each other, to make the films react with each other at a high temperature in a short time, so that a silicide film with high quality is formed without thermal damage to a substrate (for example, see Reference 1: Japanese Published Patent Application No. 2000-277750).

However, when a silicide film was provided, using the above laser light irradiation, for a miniaturized structure, i.e., a structure in which a semiconductor film and a gate insulating film are thinned, a problem was caused in which the semiconductor film in a region overlapping with a gate electrode tends to be lost. FIGS. 6A and 6B show transmission electron microscopy (TEM) photographs of a thin film transistor (hereinafter, referred to as a TFT) in which a thin semiconductor film formed over a glass substrate is irradiated with laser light. FIG. 6B is an enlarged photograph of a part of FIG. 6A. In FIGS. 6A and 6B, in the observed TFT, a gate insulating film and a semiconductor film in a region overlapping with a gate electrode are lost, as designated by a dotted circle.

Now a process of manufacturing the TFT in FIGS. 6A and 6B is presented below. First, a silicon oxynitride film which functions as a base insulating film 602 was formed with a thickness of 100 nm over a glass substrate 601, and an island-like semiconductor film 603 was formed with a thickness of 25 nm over the base insulating film. Then, in the following order, a gate insulating film with a thickness of 5 nm was formed over the island-like semiconductor film 603, and a gate electrode 605 having a stacked-layer structure of tantalum nitride with a thickness of 30 nm and tungsten with a thickness of 130 nm was formed over the island-like semiconductor film with the gate insulating film interposed therebetween. After that, a silicon oxynitride film was formed so as to cover the gate electrode and the silicon oxynitride film was etched, so that sidewall insulating layers 606 were formed at side surfaces of the gate electrode.

Next, an impurity element (phosphorus in this case) was introduced in a self-aligned manner using the gate electrode 605 and the sidewall insulating layers 606 as masks, so that a pair of impurity regions were formed in the island-like semiconductor film 603. Then, the entire substrate was irradiated with an excimer laser. FIGS. 6A and 6B are TEM photographs of a cross section of the TFT observed after the irradiation with the excimer laser.

As described above, in the TFT shown in FIGS. 6A and 6B, the gate insulating film and the semiconductor film in a region overlapping with the gate electrode were lost. The present inventors ascribe the phenomenon in FIGS. 6A and 6B to the following cause: when the metal, which is the gate electrode, absorbs the laser light and generates heat, a temperature of the semiconductor film is thought to cross a boiling point because the semiconductor film, which is thinned to have smaller thermal capacity, is heated indirectly. Not only the semiconductor film of a source region and a drain region, but the gate electrode was also heated in the laser light irradiation. A transistor with a miniaturized structure has small thermal capacity due to the thinned semiconductor film. Further, the semiconductor film under a gate electrode is also heated by heat conducted from the gate electrode because a gate insulating film is also thinned.

SUMMARY OF THE INVENTION

In view of the above problem, it is an object of the present invention to realize miniaturization and higher performance of field effect transistors, which are formed over an insulating substrate and with which there is little variation in electric characteristics, in which a silicide film with high quality is formed by treatment using laser light irradiation.

The present invention prevents a semiconductor film from being lost by laser light irradiation, by the following methods.

An aspect of a method for manufacturing a semiconductor device according to the present invention is that a film for reflecting laser light is formed in a portion where a crystalline semiconductor film and a metal film are not in contact with each other, in particular, over the gate electrode so that a portion where a silicide film is formed in the crystalline semiconductor film, i.e., a portion where the crystalline semiconductor film and the metal film are in contact with each other, is selectively irradiated with the laser light.

Further, another aspect of a method for manufacturing a semiconductor device according to the present invention is that a heat conductive film for conducting thermal energy of laser light in a lateral direction (in a plane direction of the film) is formed in a portion where a crystalline semiconductor film and a metal film are not in contact with each other, in particular, over the gate electrode so that a portion where a silicide film is formed in the crystalline semiconductor film is selectively irradiated with the laser light.

In the method for manufacturing a semiconductor device according to the present invention, a short-channel effect is suppressed because the semiconductor film of a channel formation region is thinned, while a pair of impurity regions (a source region and a drain region), i.e., the semiconductor film in a region where a silicide film is formed at an interface between the semiconductor film and a metal film, is thicker than the semiconductor film of the channel formation region so that the pair of impurity regions (the source region and the drain region) have large thermal capacity. When an island-like semiconductor film has a bump, the thickness of the pair of impurity regions or that of the channel formation region is defined by the largest thickness among thicknesses of the semiconductor film constituting each region.

In the above manner, by a silicide method using laser light irradiation, a silicide film can be formed at an interface between a semiconductor film of a pair of impurity regions (a source region and a drain region) and a metal film without losing the semiconductor film in a region overlapping with a gate electrode.

In this specification, "silicide" means a compound in general of a semiconductor and a metal as well as a compound of silicon and a metal.

According to the present invention, a silicide film can be formed by laser light irradiation without losing a semiconductor film under a gate electrode.

Further, with the use of laser light for making silicide, a process can proceed with higher controllability by appropriately setting a pulse width or parameter of laser power, whereby a desired silicide film can be formed. Furthermore, by using laser light, a silicide film with higher quality can be formed, in comparison to the use of a thermal process, without having to worrying about thermal damage to a substrate.

Therefore, with application of the present invention, miniaturization and higher performance of a field-effect transistor can be realized.

BRIEF DESCRIPTION OF DRAWINGS

In the accompanying drawings:

FIGS. 13A to 13H are diagrams showing application examples of a semiconductor device of the present invention.

DETAILED DESCRIPTION OF THE INVENTION

Embodiment Modes

Hereinafter, embodiment modes of the present invention are described with reference to the drawings. Note that the present invention can be performed in many different modes and it is easily understood by those skilled in the art that the modes and details disclosed herein can be modified in various ways without departing from the spirit and scope of the present invention. Therefore, the present invention should not be interpreted as being limited to the description of the embodiment modes to be given below.

Embodiment Mode 1

Figure 1:
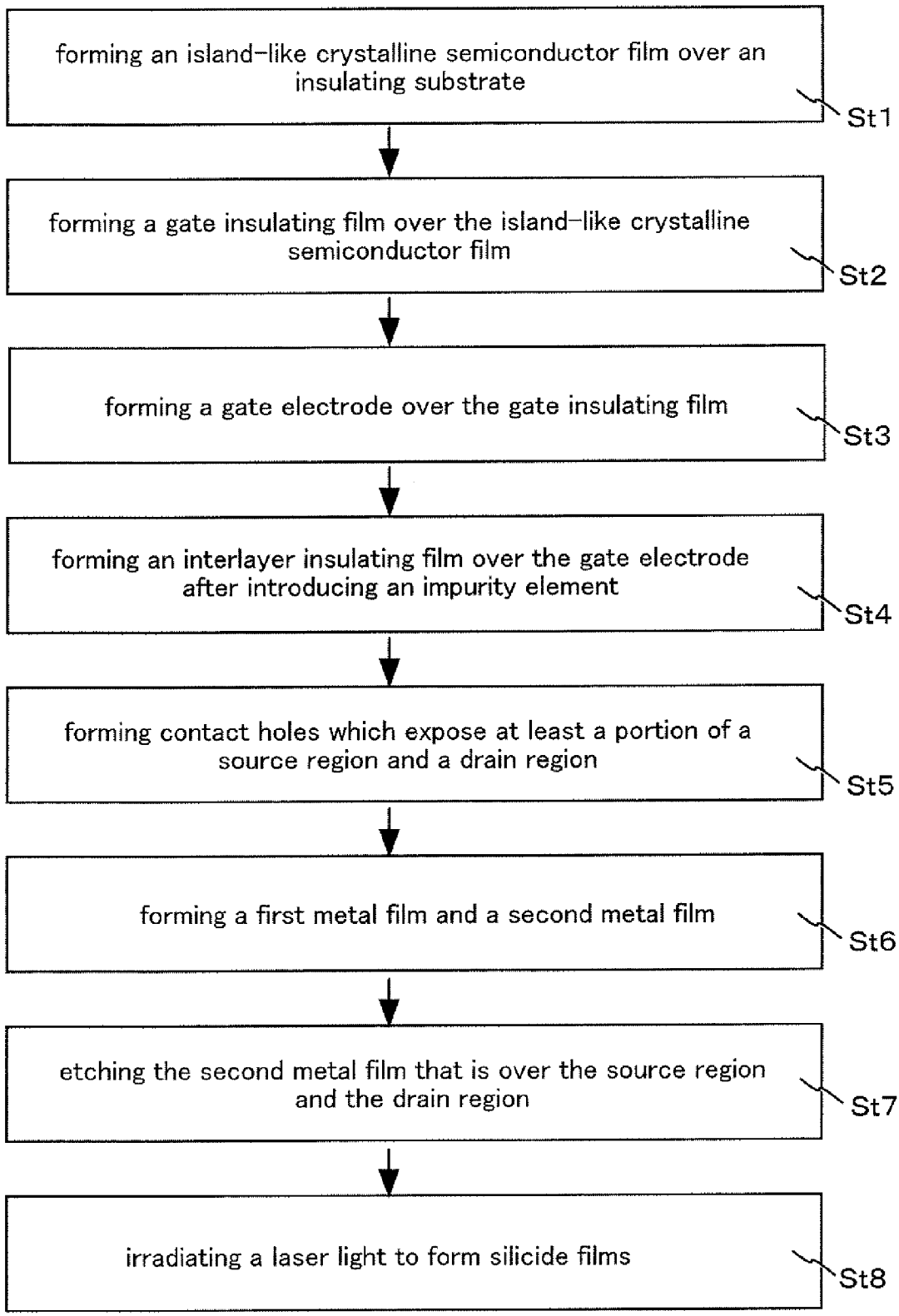
FIG. 1 is a diagram showing an example of a flow of a method for manufacturing a semiconductor device according to the present invention.

The present invention relates to a process of forming a semiconductor element having a silicide film, over a substrate having an insulating surface. FIG. 1 shows an example of a flow chart illustrating a method for manufacturing a semiconductor device according to the present invention.

First, an island-like crystalline semiconductor film is formed over an insulating substrate (St 1). Next, a gate insulating film is formed over the island-like crystalline semiconductor film (St 2), and a gate electrode is formed over the gate insulating film (St 3). An impurity element is introduced using the gate electrode as a mask to form a source region and a drain region, and then an interlayer insulating film is formed over the gate electrode (St 4). Then, contact holes which expose at least a portion of each of the source region and the drain region in the island-like crystalline semiconductor film are formed in the interlayer insulating film (St 5). Subsequently, a first metal film, and a second metal film that functions as a reflective film are formed so as to cover the exposed source region and drain region and the interlayer insulating film (St 6). Next, the second metal film located over the source region and drain region is etched (St 7). Then, the first metal film is irradiated with laser light to form silicide films selectively over the source region and drain region (St 8). In a region where the second metal film that functions as a reflective film is formed, laser light is reflected; therefore, thermal damage by laser light irradiation to the crystalline semiconductor film located under the second metal film can be alleviated. Note that the steps shown in FIG. 1 are not necessarily performed independently, and a plurality of steps may be performed consecutively.

Hereinafter, in this embodiment mode, a concrete example of a method of forming a silicide film by laser light irradiation in a top gate TFT is described with reference to FIGS. 2A to 3D.

Figure 2A:
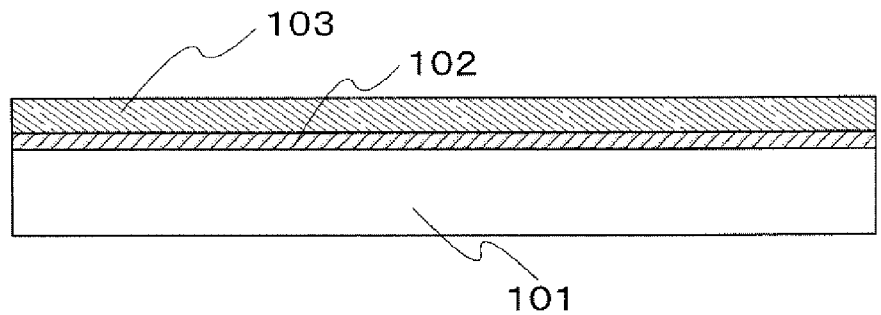
FIGS. 2A to 2D are diagrams showing an example of a method for manufacturing a semiconductor device according to the present invention.

First, an insulating film 102 which functions as a base film is formed over one surface of an insulating substrate 101 (see FIG. 2A). The insulating film 102 which functions as a base film is formed using a silicon oxide film, a silicon nitride film, a silicon nitride oxide film, a silicon oxynitride film, or the like as appropriate as a single layer or stacked layers with a thickness of 50 to 150 nm. In this embodiment mode, as the substrate having an insulating surface, a glass substrate with a thickness of 0.7 mm is used, for example. As the insulating film 102 which functions as a base film, a silicon nitride oxide film with a thickness of 150 nm is formed. The insulating film 102 can be formed by a CVD method typified by a plasma CVD method or a low-pressure CVD method, a sputtering method, or the like.

In this specification, "silicon oxynitride" means a substance in which the oxygen content is higher than the nitrogen content, and can also be referred to as "silicon oxide containing nitrogen." Further, in this specification, "silicon nitride oxide" means a substance in which the nitrogen content in higher than the oxygen content, and can also be referred to as "silicon nitride containing oxygen."

Next, an amorphous semiconductor film is formed as a semiconductor film 103 over the insulating film 102. In a similar manner to the insulating film 102, the semiconductor film 103 may be formed by a CVD method, a sputtering method, or the like. In this embodiment mode, an amorphous silicon film with a thickness of 66 nm is formed by a plasma CVD method.

The insulating film 102, which functions as a blocking film for preventing impurities from diffusing, may be provided as necessary. In a case where the insulating substrate 101 is a glass substrate containing impurities, in particular, movable ions which easily move, the insulating film 102 prevents the impurities from the glass from diffusing into the semiconductor film; however, in a case where a quartz substrate is used as the insulating substrate 101, it is not necessary to provide the insulating film 102 which functions as a blocking film.

Further, if an interface between the insulating film 102 and the semiconductor film 103 is not exposed to air in forming the semiconductor film 103 over the insulating film 102, contamination of the interface can be prevented, whereby variation in characteristics of TFTs to be manufactured can be reduced.

Next, the amorphous silicon film, which is the semiconductor film 103, is crystallized. In this embodiment mode, the semiconductor film 103 is crystallized by being scanned with continuous wave laser light arranged to have a linear form at an irradiation surface with an optical system. Through the above step, a crystalline semiconductor film can be formed. In order to enhance resistance of a semiconductor film against laser light, thermal treatment for reducing hydrogen in the semiconductor film may be performed before laser light irradiation. Further, the crystallization treatment is not limited to a laser crystallization method; and a thermal crystallization method using RTA, an annealing furnace, or the like, a thermal crystallization method using a catalyst such as nickel, or the like can be used.

Figure 2B:
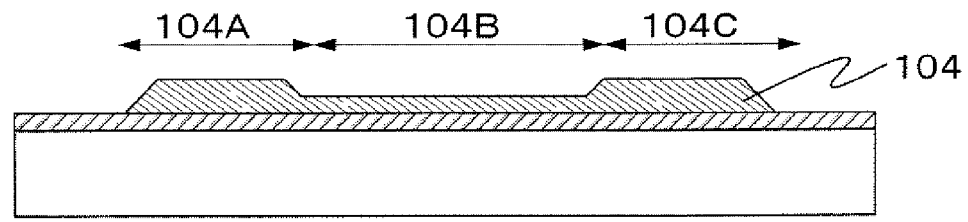
Figure 2C:
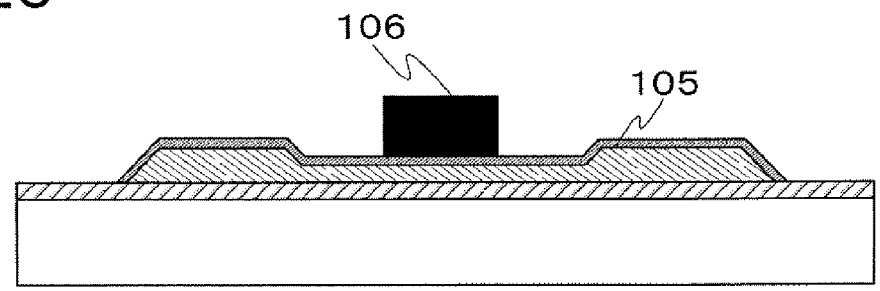

Next, the semiconductor film 103 is selectively etched through a photolithography process, so that an island-like crystalline semiconductor film 104 is formed. Further after that, as shown in FIG. 2B, only a portion of the semiconductor film (in FIG. 2B, a region 104B) is etched to be thin through a photolithography process, so that a region 104A and a region 104C, which function as a source region and a drain region, and the region 104B, which functions as a channel formation region, are formed. It is preferable that the region 104B, which functions as the channel formation region, has a thickness of about 10 to 30 nm. In the island-like crystalline semiconductor film 104, a short-channel effect can be suppressed by making the thickness of the channel formation region thin. Further, thermal capacity can be large by making the thicknesses of the source region and the drain region larger than a thickness of the channel formation region.

Further, if necessary, in order to control a threshold value of the TFT, the semiconductor film 103 may be doped with a small amount of impurity element imparting one type of conductivity (e.g., boron or phosphorus) before etching the semiconductor film 103 selectively.

For the island-like crystalline semiconductor film 104, an SOI substrate obtained by providing a single-crystalline semiconductor layer for an insulating surface may be used instead of performing a thin film process, in which a variety of crystallization methods are used. In this case, the island-like crystalline semiconductor film 104 can be formed using a single-crystalline semiconductor layer provided for an insulating surface.

Next, a surface of the island-like crystalline semiconductor film 104 is washed with an etchant containing hydrofluoric acid, and then a gate insulating film 105 is formed over the island-like crystalline semiconductor film 104. The gate insulating film 105 is formed using an insulating film containing silicon as a main component. It is preferable to perform the surface washing step and the gate insulating film formation step sequentially without exposure to air.

After washing a surface of the gate insulating film 105, a conductive layer is formed over the gate insulating film 105. The conductive layer is formed by a CVD method or a sputtering method using a conductive material. As the conductive material, a metal element such as tantalum (Ta), tungsten (W), titanium (Ti), molybdenum (Mo), chromium (Cr), aluminum (Al), copper (Cu), or niobium (Nb), or an alloy or compound material containing the above metal element can be used. Further, a semiconductor material, such as polycrystalline silicon to which an impurity element imparting one type of conductivity such as phosphorus has been added, can also be used. The conductive layer formed over the gate insulating film 105 may have either a single-layer structure or a stacked-layer structure. The conductive layer has a thickness (the total thickness thereof, if the conductive layer has a stacked-layer structure) of 50 to 1000 nm, preferably 100 to 800 nm, more preferably 200 to 500 nm.

Next, a photoresist film is applied over the conductive film and undergoes light exposure and development, so that a resist pattern is formed. The conductive film is etched using the resist pattern as a mask, so that a gate electrode 106 is formed over the gate insulating film 105 (see FIG. 2C).

Next, using the gate electrode 106 as a mask, n-type impurity ions (ions of P, As, or the like; P ions in this embodiment mode) are introduced into the island-like crystalline semiconductor film 104 through the gate insulating film 105, so that a source region and a drain region are formed.

Figure 2D:
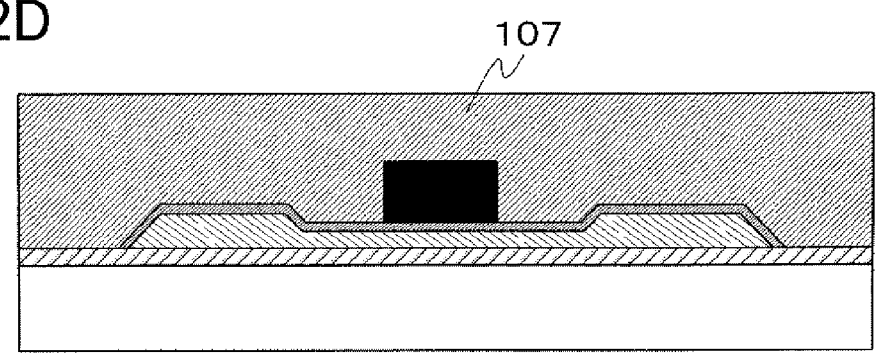

Next, an interlayer insulating film 107 is formed over an entire surface including the gate insulating film 105 and the gate electrode 106, and then hydrogenation is performed (see FIG. 2D). Subsequently, a resist pattern is formed over the interlayer insulating film 107. Using the resist pattern as a mask, the interlayer insulating film 107 and the gate insulating film 105 are etched, so that contact holes 108 which expose at least a portion of each of the source region and the drain region are formed (see FIG. 3A).

After that, the exposed surface of the island-like crystalline semiconductor film 104 is washed with hydrofluoric acid. Next, a first metal film 109 is formed over an entire surface by a sputtering method so as to cover the exposed portions of the island-like crystalline semiconductor film 104. Subsequently, a second metal film 110 that functions as a reflective film is formed over the first metal film 109. The first metal film 109 and the second metal film 110 each have a thickness of 5 to 30 nm. The first metal film 109 is formed using a material which can form a silicide film at an interface between the first metal film 109 and the crystalline semiconductor film 104 by laser light irradiation in a later step. As a material of the first metal film 109, Ni, Co, Ti, or Pt can be used, for example. For the second metal film 110 that functions as a reflective film, a material which have higher reflectance to a wavelength of the laser light with which irradiation is performed in a later step than that of the first metal film can be used. In a case where an excimer laser is used as a laser, for example, aluminum, an aluminum alloy, silver, a silver alloy, or the like can be used as a material of the second metal film 110. Further, instead of the second metal film 110, stacked layers of a silicon oxide film, a silicon nitride film, and the like may be formed to function as reflective films by a thin film interference effect.

Figure 3A:
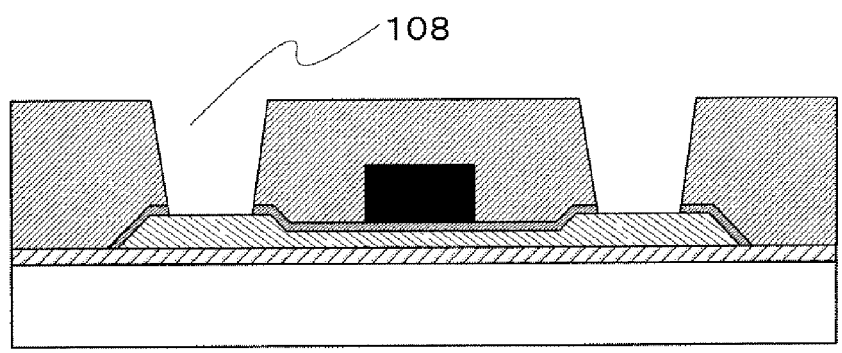
FIGS. 3A to 3D are diagrams showing an example of a method for manufacturing a semiconductor device according to the present invention.
Figure 3B:
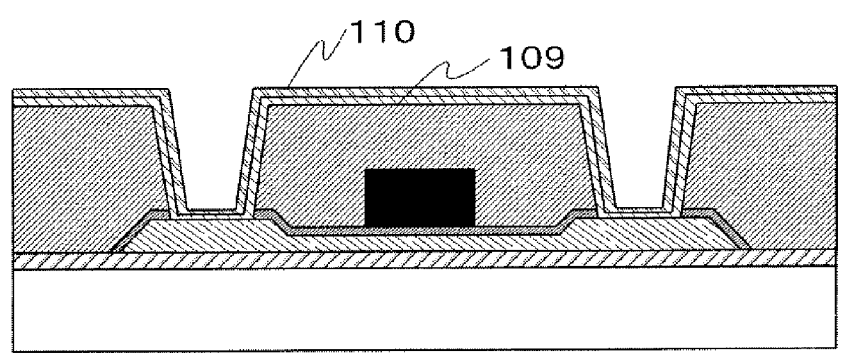
Figure 3C:
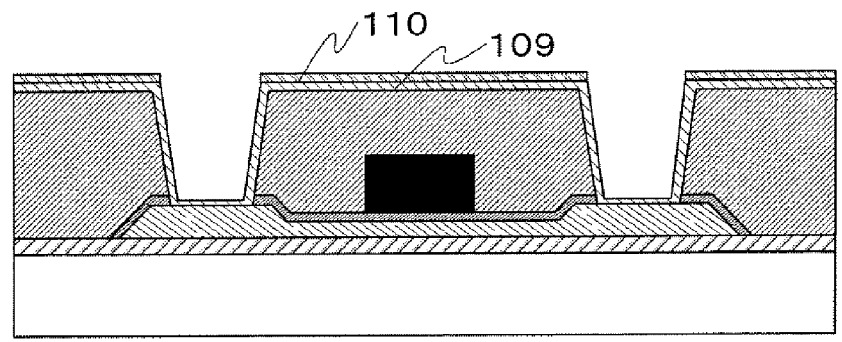

Next, the second metal film 110 located over the source region and the drain region in the island-like crystalline semiconductor film 104 is etched by a known photolithography technology (see FIG. 3C).

Figure 3D:
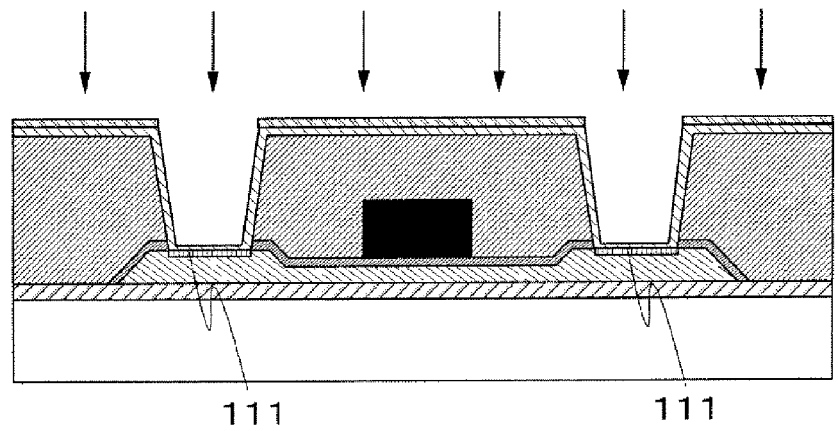

Subsequently, the first metal film 109 is irradiated with laser light from above the top surface of the second metal film 110 (see FIG. 3D). In the laser light irradiation, laser light emitted from a laser oscillator is arranged to be a linear beam by an optical system, and then is scanned in a minor axis direction of the linear form. As the laser oscillator, a variety of excimer laser oscillators such as XeCl, KrCl, KrF, ArF, or XeF can be preferably used.

The linear beam means laser light having a linear beam spot on an irradiation surface. The term "linear" used herein does not mean a line in a strict sense, but means a rectangular shape having a high aspect ratio (e.g., an aspect ratio of 10 or more (preferably, 100 or more)). The laser light is shaped into the linear beam in order to secure sufficient energy density with respect to an irradiation object. When sufficient energy density can be secured, the laser light may be shaped into a rectangular or ellipsoid beam.

When the first metal film 109 is irradiated with laser light, the second metal film 110 reflects the laser light, functioning as a reflective film. Therefore, thermal damage to the gate electrode 106 and the crystalline semiconductor film (including the channel formation region) in a region overlapping with the gate electrode 106, which are located under the second metal film 110, can be prevented. In the source region and the drain region, over which the second metal film 110 is etched away, a silicide reaction occurs at an interface between the crystalline semiconductor film 104 and the first metal film 109, so that silicide films 111 are formed in the source region and the drain region of the crystalline semiconductor film 104. As described above, the silicide films 111 can be formed in the source region and the drain region without losing the semiconductor film of the channel formation region.

Through the above process of forming a silicide film, resistance can be lowered sufficiently in the source region and drain region of the crystalline semiconductor film 104. After that, therefore, it is not necessary to activate the introduced n-type impurity element. However, it is needless to say that heat treatment may be performed in order to activate the impurity element added to the crystalline semiconductor film 104. The heat treatment can be performed by laser beam irradiation, RTA, or using an annealing furnace. Concretely, the heat treatment may be performed at temperatures of 400 to 700° C., preferably 500 to 650° C. Further, the heat treatment is preferably performed in a nitrogen atmosphere. For example, activation can be performed by heating at 550° C. for four hours. If the impurity element is activated by laser beam irradiation, an excimer laser can be used, for example.

After forming the silicide films 111, the first metal film 109 unreacted and the second metal film 110 unreacted are etched away. Next, a conductive film (e.g., an Al alloy wiring) is formed over the interlayer insulating film and in the contact holes, and is patterned, so that a source electrode and a drain electrode are formed. Through the above steps, a TFT (n-channel TFT) is formed.

The present invention is not limited to the TFT structure shown in this embodiment mode, and can also be applied to a TFT having a different structure. For example, a lightly doped drain (LDD) structure having an LDD region between a channel forming region and a drain region (or a source region) may be employed. This structure has a region to which an impurity element is added at a low concentration (hereinafter, referred to as an LDD region) between a channel forming region and a source region, or between the channel formation region and a drain region. Alternatively, a gate-drain overlapped LDD (GOLD) structure, in which an LDD region overlaps with a gate electrode with a gate insulating film interposed therebetween, may be employed.

Although this embodiment mode describes a case of an n-channel TFT, it is needless to say that a p-channel TFT can be formed using a p-type impurity element instead of the n-type impurity element. In addition, although this embodiment illustrates a top-gate TFT as an example, the present invention can be applied to an inversely-staggered TFT, for example.

In a method for manufacturing a semiconductor device according to the present invention, with the use of laser light for making silicide, a process can proceed with higher controllability by appropriately setting a pulse width or parameter of laser power, whereby a desired silicide film can be formed. With the use of laser light, furthermore, in comparison with a thermal process, a silicide film with higher quality can be formed without thermal damage to a substrate.

In a case where laser light irradiation is performed with a thinned semiconductor film in contact with a metal film, the semiconductor film can be lost. However, in the method for manufacturing a semiconductor device according to the present invention, a short-channel effect is suppressed because a semiconductor film in a region which functions as a channel formation region of a TFT is thinned; in contrast, a source region and a drain region, i.e., the semiconductor film in regions where silicide films are formed, are thicker than the semiconductor film of the channel formation region so that the source region and the drain region have large thermal capacity; thus, the semiconductor film can be prevented from being lost in laser light irradiation.

With the use of the method for manufacturing a semiconductor device according to the present invention, thermal damage to a gate electrode and to the semiconductor film in a region overlapping with the gate electrode can be reduced and silicide films can be formed in the source region and the drain region. In particular, the present invention is effective in a miniaturized TFT, i.e., a TFT in which a gate insulating film or a semiconductor film of a channel formation region is thinned.

Embodiment Mode 2

Figure 4:
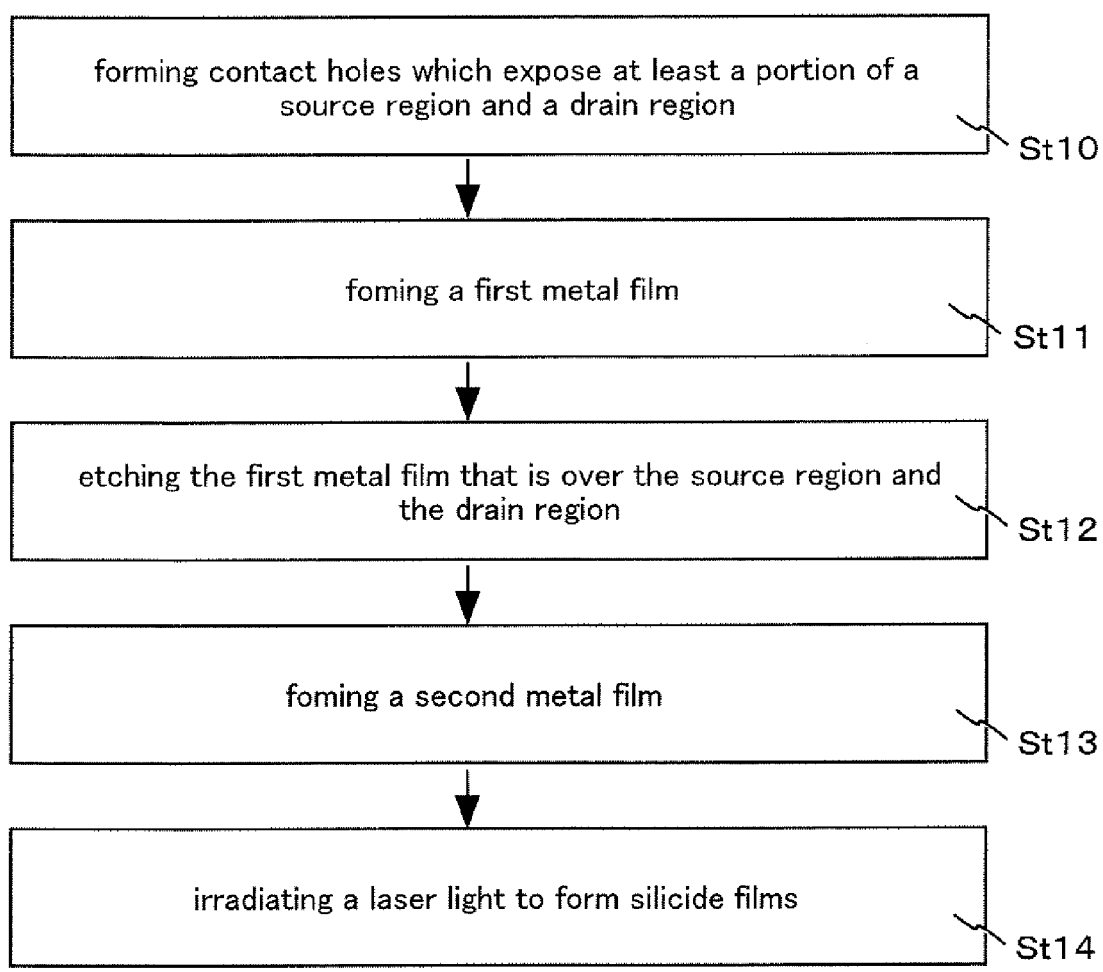
FIG. 4 is a diagram showing an example of a flow of a method for manufacturing a semiconductor device according to the present invention.

This embodiment mode illustrates an example of a method for manufacturing a semiconductor device according to the present invention, which is different from Embodiment Mode 1. FIG. 4 is an example of a flow chart illustrating a method for manufacturing a semiconductor device according to the present invention. Description is made with steps which overlaps with Embodiment Mode 1 simplified or omitted partly.

First, in a similar manner to the manufacturing steps of Embodiment Mode 1 shown in FIG. 1, contact holes which expose at least a portion of a source region and a portion of a drain region in an island-like crystalline semiconductor film are formed in an interlayer insulating film formed over a gate electrode (St 10). Subsequently, a first metal film, which functions as a heat conductive film, is formed so as to cover the exposed source and drain regions and the interlayer insulating film (St 11). Next, the first metal film located over the source region and drain region is etched (St 12). Then, a second metal film that covers the first metal film, the source region, and the drain region is formed (St 13). Next, the second metal film is irradiated with laser light, so that silicide films are formed selectively in the source region and the drain region (St 14). The first metal film is formed using a material with higher heat conductivity than the second metal film. With the use of a material with higher heat conductivity than the second metal film for the first metal film, in a region where the first metal film is formed, energy of the laser light with which the first metal film is irradiated through the second metal film is conducted in a plane direction of the first metal film; thus, thermal damage due to the laser light irradiation to the crystalline semiconductor film located under the first metal film can be alleviated. Note that the steps shown in FIG. 4 are not necessarily performed independently, and a plurality of steps may be performed consecutively. In this specification, a heat conductive film means a metal film which is formed using a material with higher heat conductivity than a metal film for forming a silicide film.

According to this embodiment mode, hereinafter, an example in which a silicide film is formed by performing laser light irradiation in a top gate TFT is illustrated concretely with reference to FIG. 5A to 5D. Steps up to forming contact holes in an interlayer insulating film covering a gate electrode can be performed by a similar manufacturing method to the steps illustrated using FIGS. 2A to 2D in Embodiment Mode 1, so that description thereof is omitted in this embodiment mode.

An insulating film 102, an island-like crystalline semiconductor film 104, a gate insulating film 105, a gate electrode 106, and an interlayer insulating film 107 are formed over an insulating substrate 101, and then contact holes 108 are formed in the interlayer insulating film 107. The contact holes 108 are formed in the following manner: a resist pattern is formed over the interlayer insulating film 107, and the interlayer insulating film 107 and the gate insulating film 105 are etched using the resist pattern as a mask. The contact holes 108 expose at least a portion of a source region and a portion of a drain region. An exposed surface of the island-like crystalline semiconductor film 104 is washed with hydrofluoric acid, and then a first metal film 409 is formed with a thickness of 5 to 30 nm over an entire surface so as to cover the exposed portions of the island-like crystalline semiconductor film 104 (see FIG. 5A). The first metal film 409 can be formed by a sputtering method, for example.

Figure 5A:
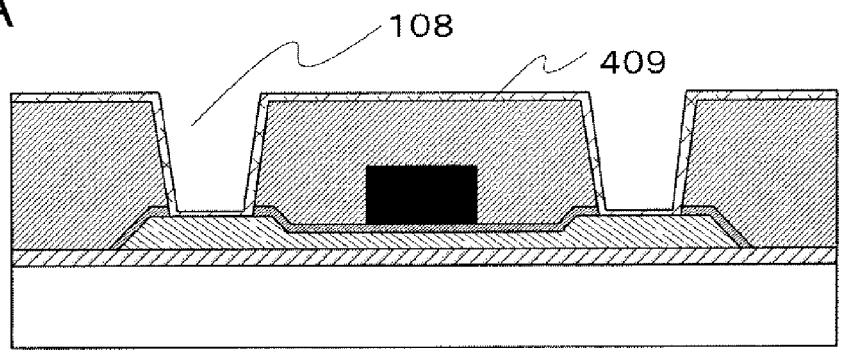
FIGS. 5A to 5D are diagrams showing an example of a method for manufacturing a semiconductor device according to the present invention.
Figure 5B:
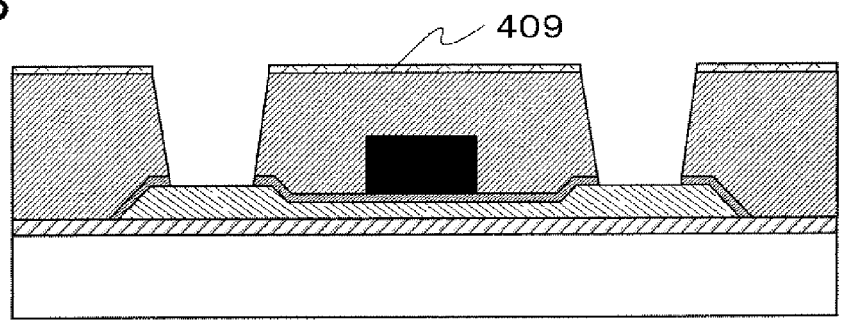
Figure 5C:
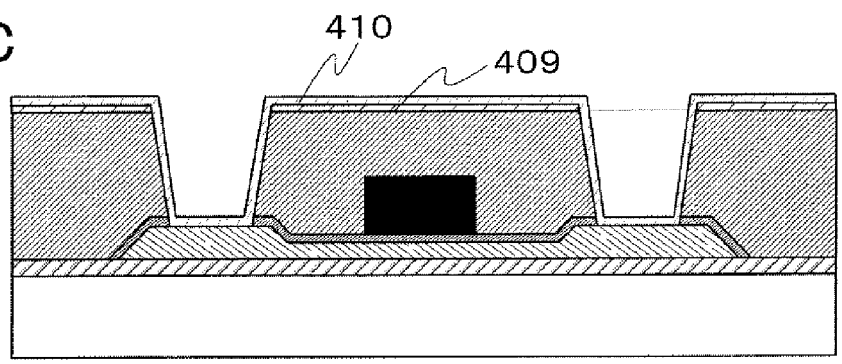

Subsequently, the first metal film 409 located over the source region and the drain region in the island-like crystalline semiconductor film 104 is etched by a photolithography technology (see FIG. 5B). After that, a second metal film 410 is formed with a thickness of 5 to 30 nm over an entire surface of the insulating substrate 101 so as to cover the exposed source region and the exposed drain region (see FIG. 5C).

The first metal film 409 is formed using such a material that can function as a heat conductive film for laser light with which irradiation is performed in a later step. For the first metal film 409, a material with higher heat conductivity than the second metal film 410 can be used: for example, copper, iron, or aluminum; an alloy compound containing any of the above metals; or stainless steel can be preferably used. The second metal film 410 is formed using such a material that can form a silicide film at an interface between the second metal film 410 and the crystalline semiconductor film 104 by laser light irradiation in a later step. As a material of the second metal film 410, Ni, Co, Ti, or Pt can be used, for example.

Figure 5D:
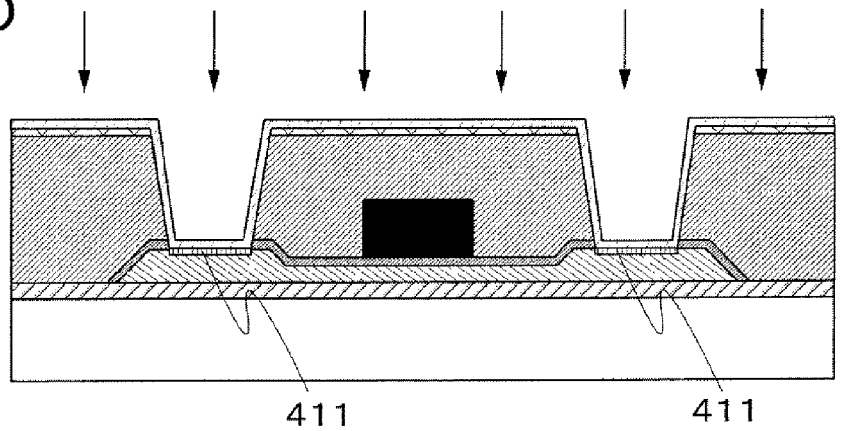
Figure 6A:
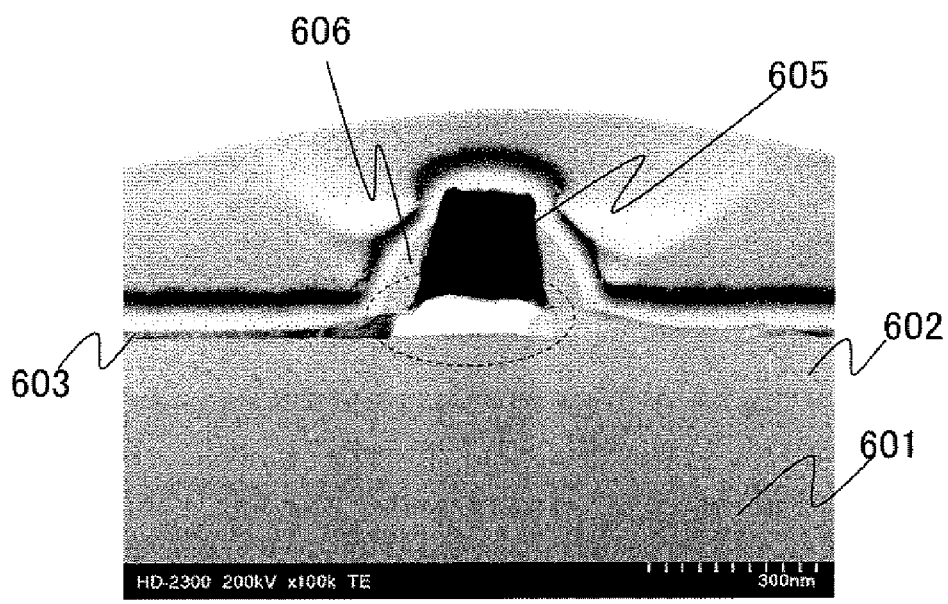
FIGS. 6A and 6B are TEM photographs of a cross section of a TFT manufactured by a conventional method.
Figure 6B:
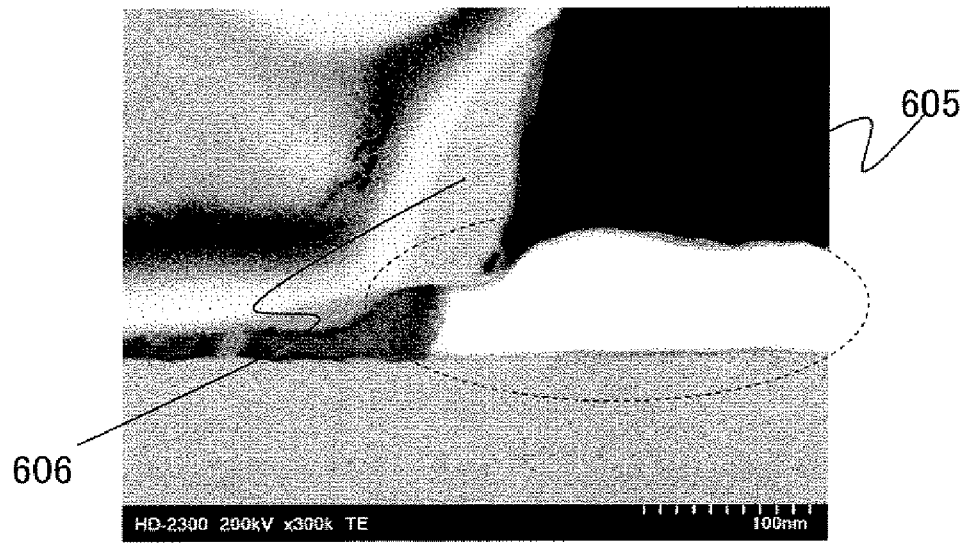

Subsequently, laser light irradiation is performed from above the top surface of the second metal film 410 (see FIG. 5D). In the laser light irradiation, laser light emitted from a laser oscillator is arranged to be a linear beam by an optical system, and then is scanned in a direction of a minor axis of the linear form. As the laser oscillator, a variety of excimer laser oscillators such as XeCl, KrCl, KrF, ArF, or XeF can be preferably used.

The first metal film 409 is formed using a material with higher heat conductivity than the second metal film 410; therefore, energy of the laser light with which the first metal film 409 is irradiated through the second metal film 410 is apt to be conducted in a plane direction of the first metal film 409, so that thermal damage to the gate electrode 106 located under the first metal film 409 and to the crystalline semiconductor film in a region overlapping with the gate electrode 106 (in particular, the channel formation region) can be prevented. In the source region and drain region located in regions which do not overlap with the first metal film 409, a silicide reaction occurs at an interface between the crystalline semiconductor film and the second metal film 410, whereby silicide films 411 are formed in the source region and the drain region of the crystalline semiconductor film. As described above, the silicide films 411 can be formed at an interface between the source region and the second metal film 410 and at an interface between the drain region and the second metal film 410 without losing the semiconductor film of the channel formation region.

Through the above process of forming silicide films, resistance can be lowered sufficiently in the source region and drain region of the crystalline semiconductor film 104. After that, therefore, it is not necessary to activate an introduced n-type impurity element. However, it is needless to say that heat treatment, strong light irradiation, or laser light irradiation may be performed in order to activate the n-type impurity element.

After forming the silicide films 411, the first metal film 409 unreacted and the second metal film 410 unreacted are etched away. Next, a conductive film (e.g., an Al alloy wiring) is formed over the interlayer insulating film and in the contact holes and is patterned, so that a source electrode and a drain electrode are formed. Through the above steps, a TFT (n-channel TFT) is formed.

An embodiment mode of the present invention is not limited to the above. For example, the following steps may be taken: after forming the contact holes in the interlayer insulating film, the first metal film for forming the silicide films is formed entirely so as to cover the source region and the drain region; subsequently, the second metal film, which functions as a heat conductive film, is formed over the first metal film; and then, the second metal film over the source region and the drain region is etched away. In this case, when laser light irradiation is performed from above the top surface of the second metal film, in a region where the second metal film is formed, energy of the laser light is conducted in a plane direction of the second metal film. In the source region and the drain region, over which the second metal film is not formed, silicide films are formed at an interface between the source region and the first metal film and at an interface between the drain region and the first metal film. In other words, the manufacturing method described herein is similar to Embodiment Mode 1, and in the manufacturing method described herein, the second metal film functions as a heat conductive film.

The present invention is not limited to the TFT structure shown in this embodiment mode, and can also be applied to a TFT having a different structure.

In a method for manufacturing a semiconductor device according to the present invention, with the use of laser light for making silicide, a process can proceed with higher controllability by appropriately setting a pulse width or parameter of laser power, whereby a desired silicide film can be formed. With the use of laser light, furthermore, a silicide film with higher quality can be formed without thermal damage to a substrate, in comparison with a thermal process.

In a case where laser light irradiation is performed with a thinned semiconductor film in contact with a metal film, the semiconductor film can be lost. However, in the method for manufacturing a semiconductor device according to the present invention, a short-channel effect is suppressed because a semiconductor film in a region which functions as a channel formation region of a TFT is thinned; in contrast, a source region and a drain region, i.e., the semiconductor film in regions where silicide films are formed, are thicker than the semiconductor film of the channel formation region so that the source region and the drain region have large thermal capacity; thus, the semiconductor film can be prevented from being lost in laser light irradiation.

With the use of the method for manufacturing a semiconductor device according to the present invention, thermal damage to a gate electrode and to the semiconductor film in a region overlapping with the gate electrode can be reduced and silicide films can be formed in the source region and the drain region. In particular, the present invention is effective in a miniaturized TFT, i.e., a TFT in which a gate insulating film or a semiconductor film of a channel formation region is thinned.

Embodiment Mode 3

A semiconductor device manufactured according to the present invention can be applied to an integrated circuit such as a CPU (central processing unit). Hereinafter, this embodiment mode describes an example of a CPU to which the semiconductor device shown in Embodiment 1 or 2 is applied with reference to the drawings.

Figure 7:
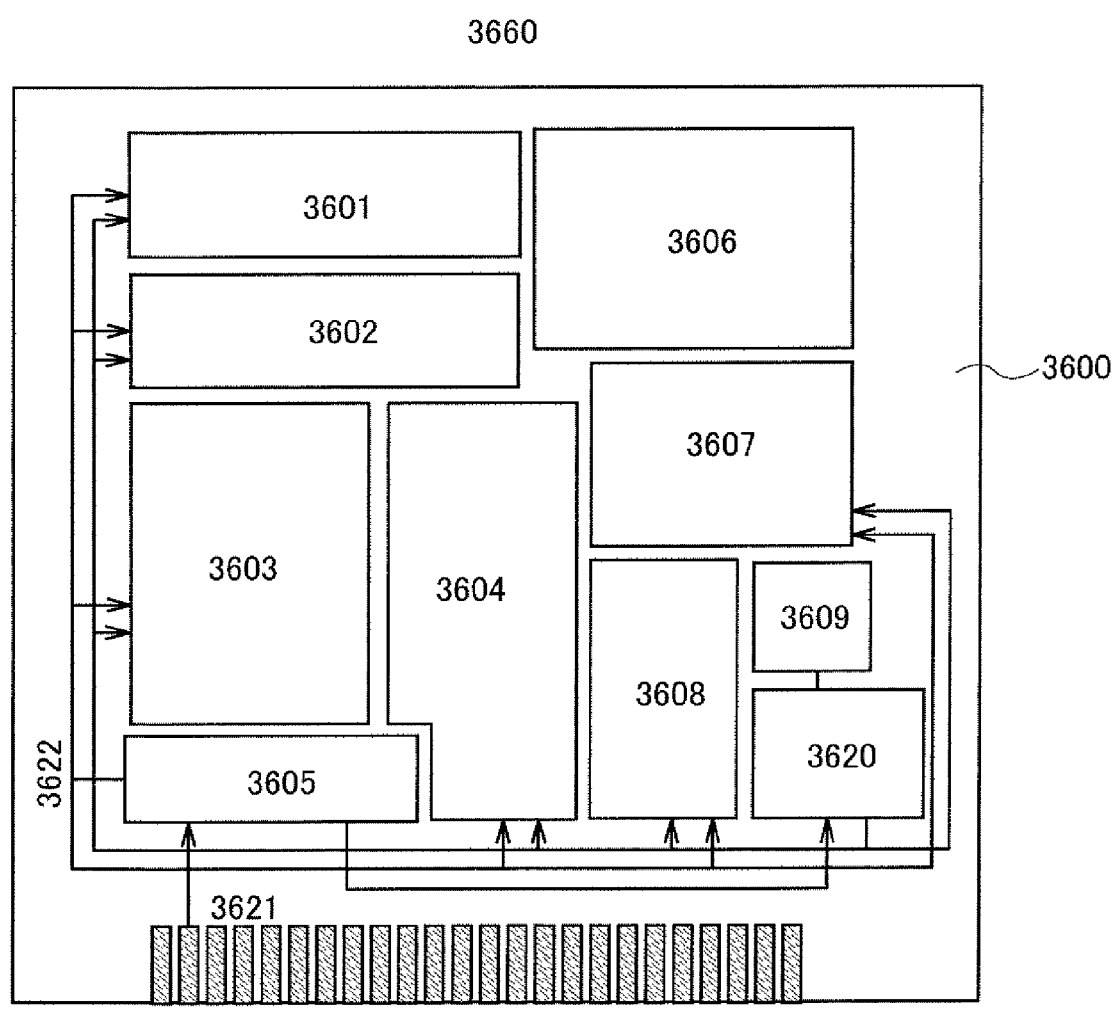
FIG. 7 is a block diagram showing an example of a semiconductor device of the present invention.

A CPU 3660 shown in FIG. 7 mainly includes an arithmetic logic unit (ALU) 3601, an ALU controller 3602, an instruction decoder 3603, an interrupt controller 3604, a timing controller 3605, a register 3606, a register controller 3607, a bus interface (bus I/F) 3608, an erasable programmable ROM 3609, and a ROM interface (ROM I/F) 3620, over a substrate 3600. The ROM 3609 and the ROM interface 3620 may be provided over different chips. Such a variety of circuits included in the CPU 3660 can be formed using the thin film transistor described in Embodiment Mode 1 or 2; or a CMOS circuit, an nMOS circuit, a pMOS circuit, or the like in which the thin film transistors in Embodiment Mode 1 or 2 are combined.

The CPU 3660 shown in FIG. 7 is merely an example illustrated with a simplified structure, and an actual CPU has a variety of structures depending on the usage. Therefore, the structure of the CPU to which the present invention is applied is not limited to that shown in FIG. 7.

An instruction input to the CPU 3660 through the bus interface 3608 is input to the instruction decoder 3603 and decoded therein, and then is input to the ALU controller 3602, the interrupt controller 3604, the register controller 3607, and the timing controller 3605.

The ALU controller 3602, the interrupt controller 3604, the register controller 3607, and the timing controller 3605 perform various controls based on the decoded instruction. Concretely, the ALU controller 3602 generates a signal for controlling the driving of the ALU 3601. While the CPU 3660 is executing a program, the interrupt controller 3604 judges an interrupt request from an external input/output device or a peripheral circuit based on its priority or a mask state, and processes the request. The register controller 3607 generates an address of the register 3606, and reads/writes data from/to the register 3606 in accordance with the state of the CPU.

The timing controller 3605 generates a signal for controlling timing of driving of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the internal clock signal CLK2 to the above various circuits.

Figure 8:
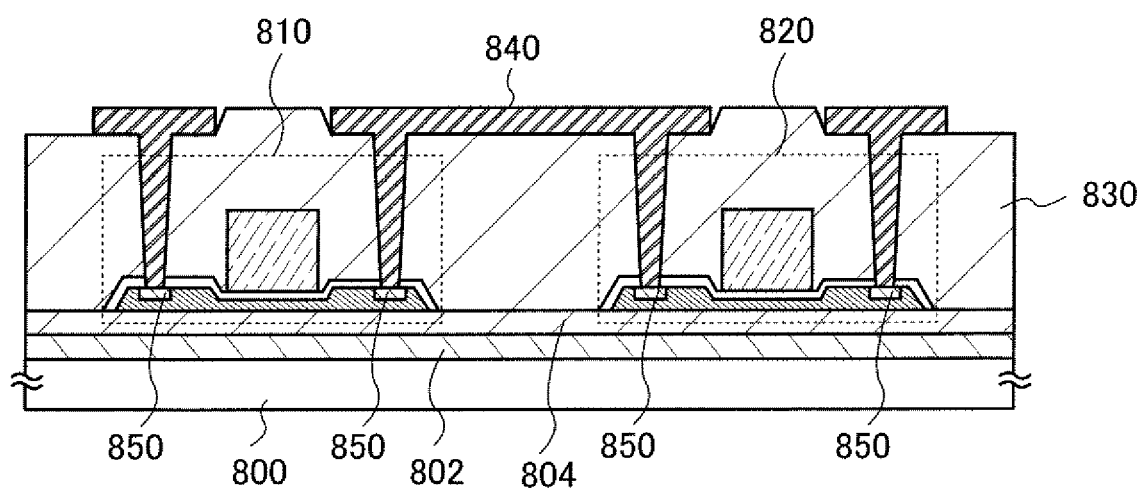
FIG. 8 is a cross-sectional view showing an example of a semiconductor device of the present invention.

Here, an example of a CMOS circuit which can be applied to the CPU 3660 is shown (see FIG. 8). In the CMOS circuit shown here, a transistor 810 and a transistor 820 are formed over a substrate 800 with insulating layers 802 and 804 interposed therebetween. Further, an insulating layer 830 is formed to cover the transistors 810 and 820, and conductive layers 840 that are electrically connected to the transistors 810 and/or 820 are formed over the insulating layer 830. Furthermore, the transistors 810 and 820 are electrically connected to each other through the conductive layer 840. In the transistors 810 and 820, silicide films 850 are formed by the method shown in the above embodiment modes.

For the substrate 800, a substrate having an insulating surface may be used. For example, a glass substrate, a quartz substrate, a sapphire substrate, a ceramic substrate, a metal substrate for which an insulating layer is provided on a surface, or the like can be used.

The insulating layers 802 and 804 are formed by a CVD method, a sputtering method, or an ALD method using silicon oxide, silicon nitride, silicon oxynitride, silicon nitride oxide, or the like. The insulating layers 802 and 804 function as blocking layers, which prevent an alkaline earth metal and the like from diffusing into the transistor 810 or 820 from the substrate 800 and thus contaminating the transistor 810 or 820. Further, if the substrate 800 has asperities at the surface, the insulating layers 802 and 804 can also function as planarizing layers. However, it is not necessary to form the insulating layers 802 and 804 if impurities diffused from the substrate 800 and asperities at a surface of the substrate 800 do not present any problem. Further, the base insulating layer may have a single-layer structure or a stacked-layer structure including three or more layers although the base insulating layer has a two-layer structure here.

The transistor shown in Embodiment Mode 1 or 2 is preferably applied to the transistors 810 and 820. The transistors 810 and 820 have different types of conductivity. For example, the transistor 810 may be an n-channel transistor, and the transistor 820 may be a p-channel transistor.

The insulating layer 830 is formed by a CVD method, a sputtering method, an ALD method, a coating method, or the like, using an inorganic insulating material containing oxygen or nitrogen, such as silicon oxide, silicon nitride, silicon oxynitride, or silicon nitride oxide; an insulating material containing carbon, such as diamond-like carbon (DLC); an organic insulating material, such as epoxy, polyimide, polyamide, polyvinyl phenol, benzocyclobutene, or acrylic; or a siloxane material, such as a siloxane resin. The siloxane material corresponds to a material having Si—O—Si bonds. Siloxane includes a skeleton structure of a bond of silicon (Si) and oxygen (O). As a substituent, an organic group containing at least hydrogen (e.g., an alkyl group or aromatic hydrocarbon) is used. Alternatively, a fluoro group, or a fluoro group and an organic group containing at least hydrogen can be used as a substituent. Further, the insulating layer 830 may also be formed by forming an insulating layer by a CVD method, a sputtering method, or an ALD method and then performing high-density plasma treatment thereto in an oxygen atmosphere or a nitrogen atmosphere. Although an example in which the insulating layer 830 has a single-layer structure is shown here, the insulating layer 830 may have a stacked-layer structure including two or more layers. Further, the insulating layer 830 may be formed by combining an inorganic insulating layer and an organic insulating layer.

The conductive layers 840 are formed by a CVD method or a sputtering method, using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mn), or neodymium (Nd), carbon (C), silicon (Si), or an alloy material or compound material containing the above element, to have a single-layer structure or a stacked-layer structure. As examples of an alloy material containing aluminum, an alloy material containing aluminum as its main component and further containing nickel, and an alloy material containing aluminum as its main component and further containing nickel and at least one of carbon and silicon can be given. The conductive layers 840 can employ a stacked-layer structure of a barrier layer, an aluminum-silicon (Al—Si) layer, and a barrier layer, or a stacked-layer structure of a barrier layer, an aluminum-silicon layer, a titanium nitride layer, and a barrier layer, for example. The barrier layer corresponds to a thin film formed of titanium, nitride of titanium, molybdenum, or nitride of molybdenum. Aluminum or aluminum silicon, which has low resistance and is inexpensive, is suitable for forming the conductive layers 840. Further, generation of a hillock of aluminum or aluminum silicon can be prevented if upper and lower barrier layers are provided.

The conductive layers 840 function as a source electrode and a drain electrode. The conductive layers 840 are electrically connected to the transistors 810 and 820 through openings formed in the insulating layer 830. Concretely, the conductive layers 840 are electrically connected to a source region and a drain region of the transistor 810, and to a source region and a drain region of the transistor 820. Further, the source region or the drain region of the transistor 810 is electrically connected to the source region or the drain region of the transistor 820 through the conductive layer 840. In the above manner, the CMOS circuit can be formed.

Figure 9:
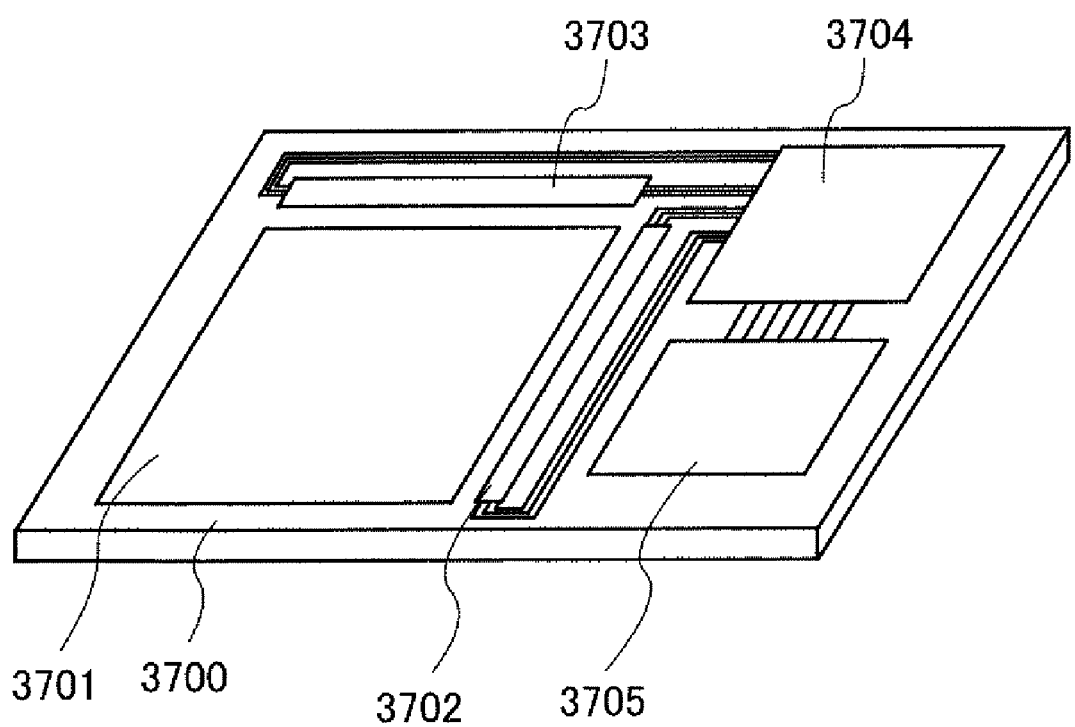
FIG. 9 is a perspective view showing an example of a semiconductor device of the present invention.

FIG. 9 shows a display device in which a pixel portion, a CPU, and other circuits are formed over the same substrate: a so-called "system-on-panel". A pixel portion 3701, a scanning line driver circuit 3702 for selecting a pixel included in the pixel portion 3701, and a signal line driver circuit 3703 for supplying a video signal to each selected pixel are provided over a substrate 3700. A CPU 3704 is connected to other circuits (e.g., a control circuit 3705) with wirings which are led from the scanning line driver circuit 3702 and the signal line driver circuit 3703. The control circuit includes an interface. Further, a connection portion with an FPC terminal is provided at an end portion of the substrate to interact with an external signal.

As other circuits, in addition to the control circuit 3705, for example an image signal process circuit, a power source circuit, a gray scale power source circuit, a video RAM, a memory (e.g., DRAM, SRAM, or PROM), and the like can be provided. Such a circuit may be formed using an IC chip and mounted on the substrate. Further, the scanning line driver circuit 3702 and the signal line driver circuit 3703 are not necessarily formed over the same substrate: for example, the scanning line driver circuit 3702 may be formed over the same substrate as that for the pixel portion, and the signal line driver circuit 3703 may be formed using an IC chip and mounted on the substrate.

Although this embodiment mode describes an example in which a semiconductor device according to the present invention is applied to a CPU, the present invention is not particularly limited to this application example. For example, a semiconductor device according to the present invention can be applied to a pixel portion, a driver circuit portion, or the like of a display device including an organic light-emitting element, an inorganic light-emitting element, a liquid crystal display element, or the like. Furthermore, with application of the present invention, the following can also be manufactured: a digital camera, an audio reproducing device such as a car audio system, a laptop computer, a game machine, a portable information terminal (e.g., a mobile phone or a mobile game machine), an image reproducing device provided with a recording medium, such as a home-use game machine, and the like.

In a semiconductor device to which the present invention is applied, damage to a semiconductor film and a gate electrode is alleviated in a manufacturing process. Further, with application of the present invention, variation in characteristics can be suppressed in semiconductor devices such as transistors. Therefore, semiconductor devices with high reliability can be provided in a high yield.

A semiconductor device to which the present invention is applied includes silicide films, and thus can have low contact resistance (contact resistance between a conductive layer and a semiconductor layer); therefore, signal delay and the like can be prevented. Accordingly, a circuit can be driven at high speed.

Embodiment Mode 4

This embodiment mode describes an example of a usage mode of the semiconductor device described in the preceding embodiment modes Concretely, an application example of a semiconductor device to/from which data can be input/output without contact is described below with reference to the drawings. The semiconductor device to/from which data can be input/output without contact is also called an RFID tag, an ID tag, an IC tag, an IC chip, an RF tag, a wireless tag, an electronic tag, or a wireless chip depending on the usage mode.

An example of a top structure of a semiconductor device shown in this embodiment mode is described with reference to FIG. 10A. A semiconductor device 2180 shown in FIGS. 10A to 10C includes a thin film integrated circuit 2131 including a plurality of elements such as thin film transistors that constitute a memory portion and a logic portion, and a conductive layer 2132 that serves as an antenna. The conductive layer 2132 that serves as an antenna is electrically connected to the thin film integrated circuit 2131. The thin film transistor described in Embodiment Mode 1 or 2 of the present invention can be applied to the thin film integrated circuit 2131.

Figure 10A:
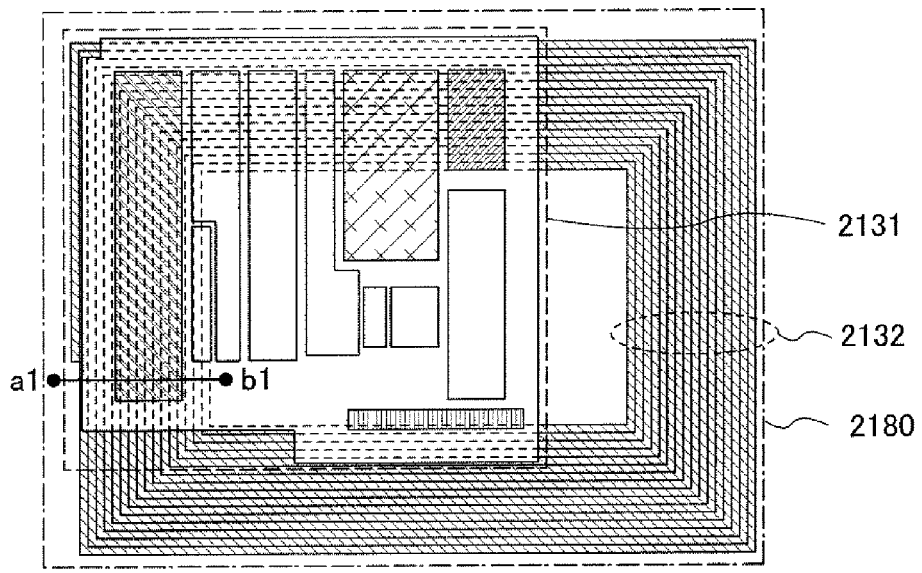
FIG. 10A is a top view.
Figure 10B:
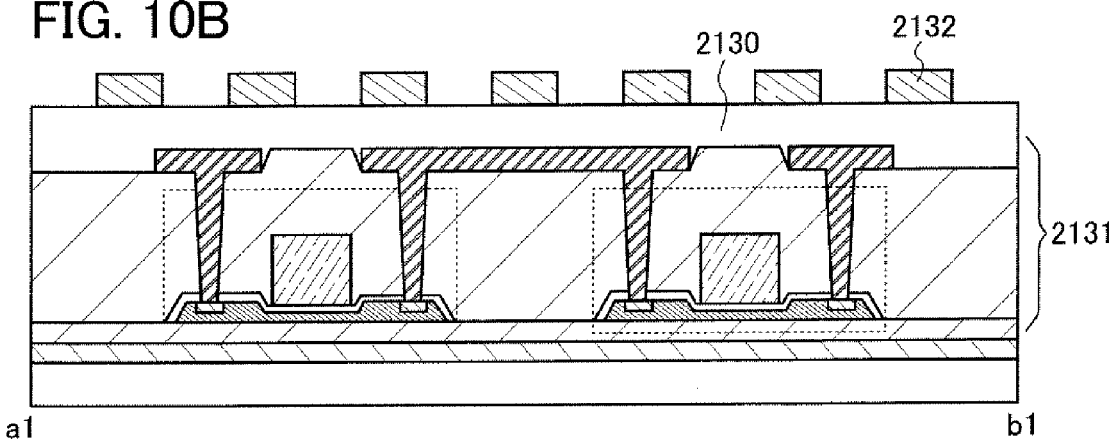
FIGS. 10B and 10C are cross-sectional views showing an example of a semiconductor device of the present invention.
Figure 10C:
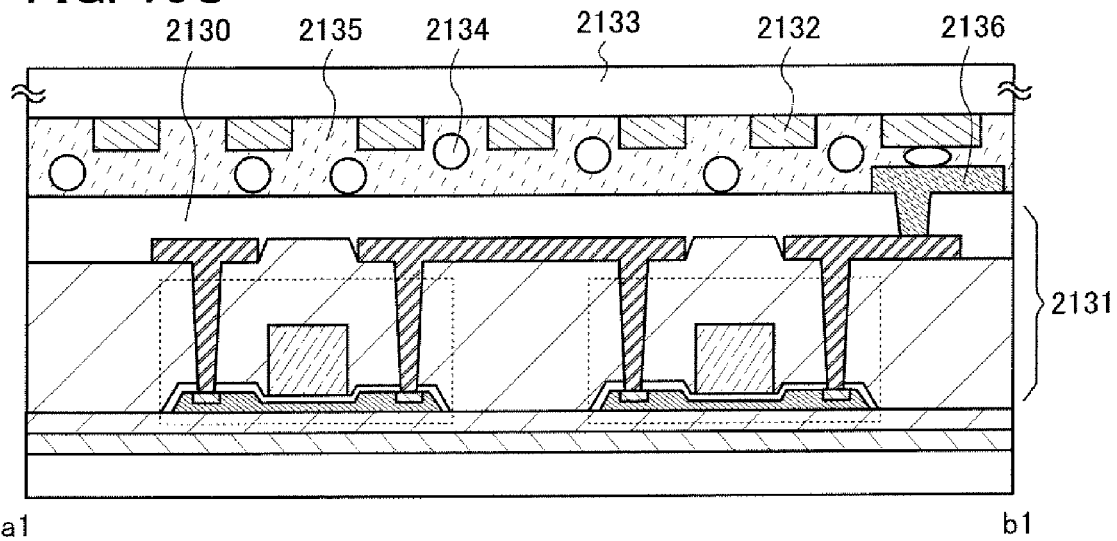

FIGS. 10B and 10C show schematic cross-sectional views of FIG. 10A. The conductive layer 2132 that serves as an antenna may be provided above the elements that constitute the memory portion and the logic portion: for example, the conductive layer 2132 that serves as an antenna can be provided above the thin film integrated circuit 2131 constituted of the thin film transistors shown in the preceding embodiment modes with an insulating layer 2130 interposed therebetween (see FIG. 10B). Further, the conductive layer 2132 that serves as an antenna may be provided for a substrate 2133, and then the substrate 2133 and the thin film integrated circuit 2131 may be attached to each other so as to sandwich the conductive layer 2132 (see FIG. 10C). FIG. 10C shows an example in which a conductive layer 2136 provided over the insulating layer 2130 and the conductive layer 2132 that serves as an antenna are electrically connected to each other with conductive particles 2134 contained in an adhesive resin 2135.

Although this embodiment mode describes an example in which the conductive layer 2132 that serves as an antenna is provided in a shape of a coil and either an electromagnetic induction method or an electromagnetic coupling method is employed, the semiconductor device of the present invention is not limited thereto, and a microwave method may be employed as well. In a case of a microwave method, the shape of the conductive layer 2132 that serves as an antenna may be determined as appropriate depending on the wavelength of an electromagnetic wave.

Figure 11A:
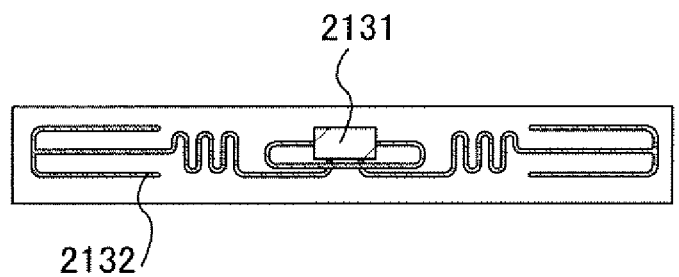
FIGS. 11A to 11D are diagrams illustrating antennas which can be applied to a semiconductor device of the present invention.
Figure 11B:
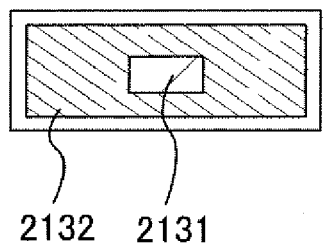
Figure 11C:
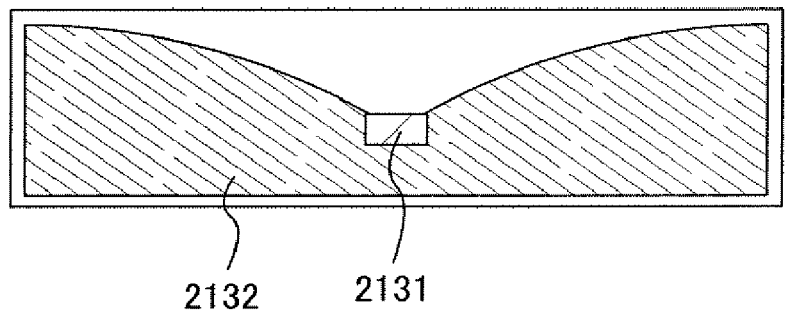
Figure 11D:
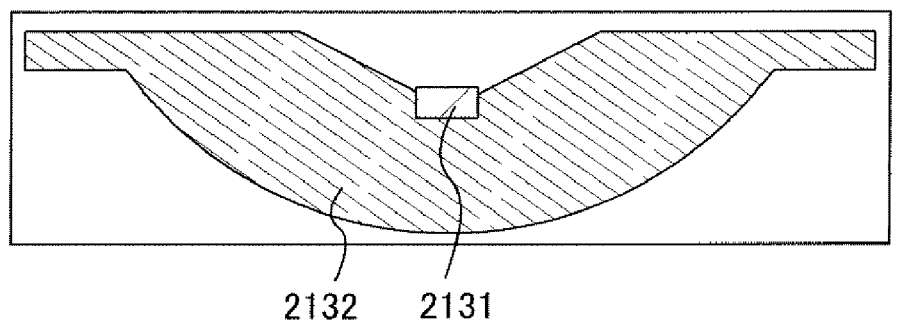

For example, when the microwave method (e.g., with an UHF band (in the range of 860 to 960 MHz), a frequency band of 2.45 GHz, or the like) is employed as the signal transmission method of the semiconductor device 2180, the shape such as the length of the conductive layer which serves as an antenna may be set as appropriate in consideration of the wavelength of an electromagnetic wave used for sending a signal. For example, the conductive layer which serves as an antenna can be formed into the shape of a line (e.g., a dipole antenna (see FIG. 11A)), the flat shape (e.g., a patch antenna (see FIG. 11B)), the shape of a ribbon (see FIGS. 11C and 11D), or the like. Further, the shape of the conductive layer 2132 that serves as an antenna is not limited to a line, and the conductive layer in the shape of a curved line, in an S-shape, or in a shape combining them may be provided as well in consideration of the wavelength of the electromagnetic wave.

The conductive layer 2132 that serves as an antenna is formed using a conductive material by a CVD method, a sputtering method, a printing method such as a screen printing method or a gravure printing method, a droplet discharging method, a dispenser method, a plating method, or the like. As the conductive material, a metal element such as aluminum (Al), titanium (Ti), silver (Ag), copper (Cu), gold (Au), platinum (Pt), nickel (Ni), palladium (Pd), tantalum (Ta), or molybdenum (Mo), or an alloy material or compound material containing any of the above metal elements is used, and the conductive layer 2132 employs a single-layer structure or a stacked-layer structure.

For example, in a case where the conductive layer 2132 that serves as an antenna is formed by a screen printing method, it can be formed by selectively printing a conductive paste in which conductive particles with a grain diameter of several nm to several tens of μm are dissolved or dispersed in an organic resin. The conductive particles can be fine particles or dispersive nanoparticles of one or more kinds of metals selected from silver (Ag), gold (Au), copper (Cu), nickel (Ni), platinum (Pt), palladium (Pd), tantalum (Ta), molybdenum (Mo), and titanium (Ti), or silver halide. Further, as the organic resin contained in the conductive paste, at least one of organic resins which function as a binder, a solvent, a dispersing agent, and a coating material of metal particles can be used. Typically, an organic resin such as an epoxy resin and a silicone resin can be given as an example. Further, in forming the conductive layer, it is preferable to bake the conductive paste after providing it. For example, in a case of using fine particles (e.g., with a grain diameter of 1 to 100 nm inclusive) containing silver as its main component as a material of the conductive paste, the conductive layer can be formed by baking the conductive paste at temperatures in the range of 150 to 300° C. to harden it. Further, fine particles containing solder or lead-free solder as its main component may be used. In this case, fine particles with a grain diameter of 20 μm or less are preferably used. Solder and lead-free solder have the advantage of low cost.

In a semiconductor device to which the present invention is applied, damage to a gate electrode and a semiconductor film can be suppressed in a manufacturing process; therefore, a semiconductor device with high reliability can be provided in a high yield. Further, the present invention can also be applied to a small semiconductor device to/from which data can be input/output without contact, as described in this embodiment mode.

Next, an operation example of the semiconductor device of this embodiment mode is described.

Figure 12A:
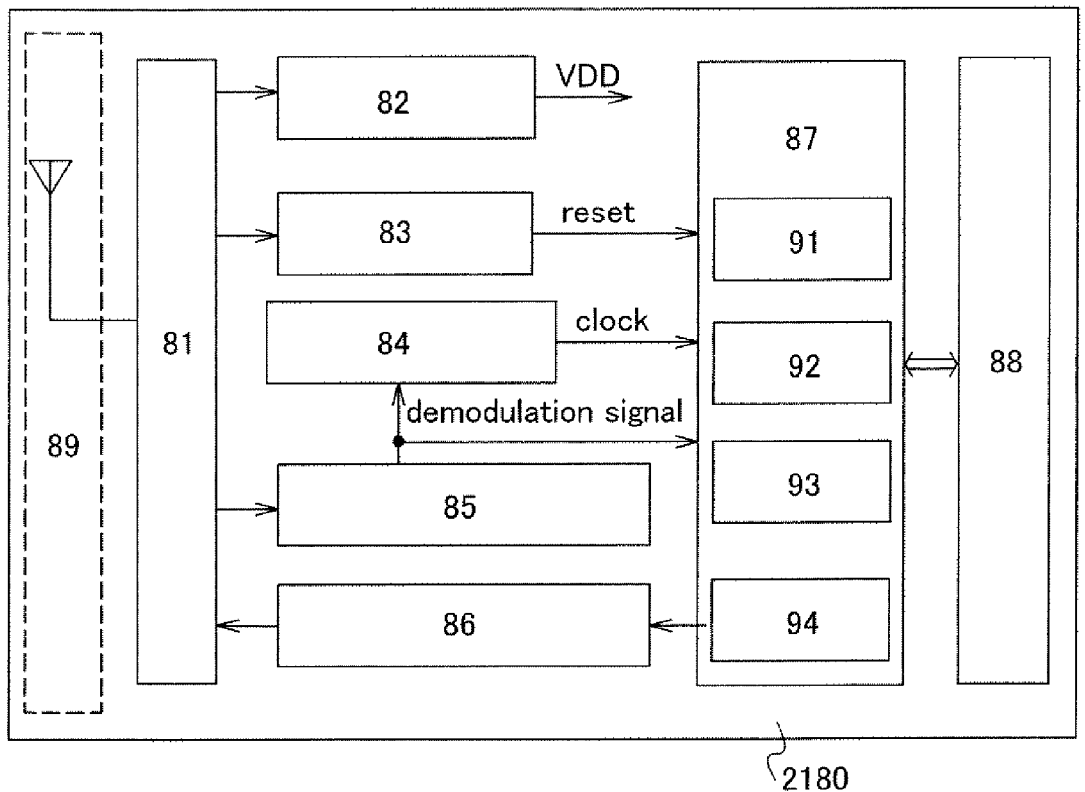
FIG. 12A is a block diagram of an example of a semiconductor device of the present invention.

The semiconductor device 2180 has a function of exchanging data without contact, and includes a high-frequency circuit 81, a power source circuit 82, a reset circuit 83, a clock generating circuit 84, a data demodulating circuit 85, a data modulating circuit 86, a controlling circuit 87 for controlling other circuits, a memory circuit 88, and an antenna 89 (see FIG. 12A). The high-frequency circuit 81 receives a signal from the antenna 89 and outputs a signal received from the data modulating circuit 86, through the antenna 89. The power source circuit 82 generates power source potential from a received signal. The reset circuit 83 generates a reset signal. The clock generating circuit 84 generates various clock signals based on a received signal input from the antenna 89. The data demodulating circuit 85 demodulates a received signal and outputs it to the controlling circuit 87. The data modulating circuit 86 modulates a signal received from the controlling circuit 87. As the controlling circuit 87, a code extracting circuit 91, a code judging circuit 92, a CRC judging circuit 93, and an output unit circuit 94 are provided, for example. The code extracting circuit 91 extracts each of a plurality of codes included in an instruction sent to the controlling circuit 87. The code judging circuit 92 judges the content of the instruction by comparing each extracted code with a code corresponding to a reference. The CRC judging circuit 93 detects whether or not there is a transmission error or the like based on a judged code. In FIG. 12A, in addition to the controlling circuit 87, the high-frequency circuit 81 and the power source circuit 82 which are analog circuits are included.

Next, one example of an operation of the above semiconductor device is described. First, a radio signal is received by the antenna 89 and then sent to the power source circuit 82 through the high-frequency circuit 81, so that high power source potential (hereinafter, referred to as VDD) is generated. VDD is supplied to each circuit in the semiconductor device 2180. A signal sent to the data demodulating circuit 85 through the high-frequency circuit 81 is demodulated (hereinafter, this signal is referred to as a demodulated signal). Moreover, signals which have passed through the reset circuit 83 and the clock generating circuit 84 through the high-frequency circuit 81, and the demodulated signal are sent to the controlling circuit 87. The signals sent to the controlling circuit 87 are analyzed by the code extracting circuit 91, the code judging circuit 92, the CRC judging circuit 93, and the like. Then, based on the analyzed signals, information of the semiconductor device which is stored in the memory circuit 88 is output. The output information of the semiconductor device is encoded through the output unit circuit 94. Further, the encoded information of the semiconductor device 2180 passes through the data modulating circuit 86 and then is sent by the antenna 89 as a radio signal. In the plurality of circuits included in the semiconductor device 2180, low power source potential (hereinafter, referred to as VSS) is common and GND can be used as VSS.

In this manner, by sending a signal from a communication unit (e.g., a reader/writer or a unit having a function of a reader or a writer) to the semiconductor device 2180 and receiving a signal sent from the semiconductor device 2180 with the reader/writer, data of the semiconductor device can be read.

Further, in the semiconductor device 2180, a power source voltage may be supplied to each circuit with electromagnetic waves without providing a power source (a battery), or a power source (battery) may be provided so that a power source voltage is supplied to each circuit with both electromagnetic waves and the power source (battery).

Figure 12B:
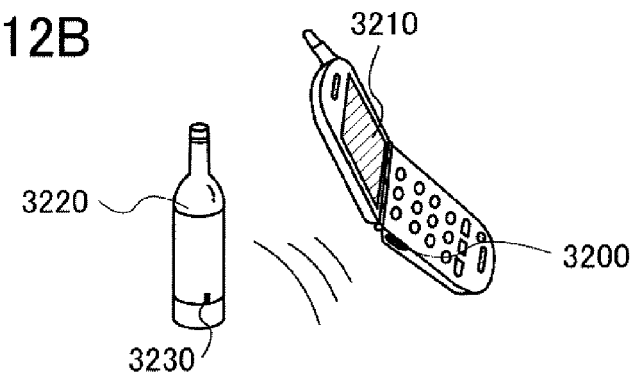
FIGS. 12B and 12C are diagrams showing examples of usage modes of a semiconductor device of the present invention.
Figure 12C:
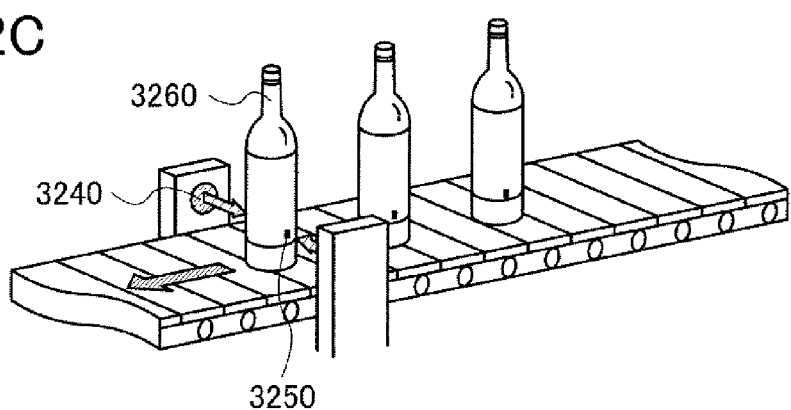

Next, one example of usage modes of the semiconductor device to/from which data can be input/output without contact is described. A side surface of a mobile terminal including a display portion 3210 is provided with a communication unit 3200, and a side surface of a product 3220 is provided with a semiconductor device 3230 (see FIG. 12B). The communication unit 3200 has functions of reading and transmitting a signal like a reader/writer, or has only either function of reading or transmitting a signal. When the communication unit 3200 is held over the semiconductor device 3230 included in the product 3220, the display portion 3210 displays information on the product, such as a row material, a place of origin, an inspection result for each production step, a history of distribution process, or description of the product. Further, when a product 3260 is transferred by a conveyer belt, the product 3260 can be inspected with the use of a communication unit 3240 and a semiconductor device 3250 provided for the product 3260 (see FIG. 12C). As the semiconductor devices 3230 and 3250, the above semiconductor device 2180 can be applied. In this manner, with the use of the semiconductor device according to the present invention in the system, information can be obtained easily and higher performance and a high added value are achieved. Further, the semiconductor device according to the present invention has high reliability, and inspection of a product or the like can be performed reliably.

An applicable range of the semiconductor device according to the present invention is wide in addition to the above, and the semiconductor device can be applied to any product as long as it clarifies information of an object, such as the history thereof, without contact and is useful for production, management, or the like. For example, the semiconductor device can be provided for bills, coins, securities, certificates, bearer bonds, packing containers, books, recording media, personal belongings, vehicles, foods, clothing, health products, commodities, medicine, electronic devices, and the like. Examples thereof are described with reference to FIGS. 13A to 13H.

The bills and coins are money distributed to the market, and include what is valid in a certain area (a cash voucher), memorial coins, and the like. The securities refer to checks, certificates, promissory notes, and the like (see FIG. 13A). The certificates refer to drivers' licenses, certificates of residence, and the like (see FIG. 13B). The bearer bonds refer to stamps, rice coupons, various gift certificates, and the like (see FIG. 13C). The packing containers refer to wrapping paper for food containers and the like, plastic bottles, and the like (see FIG. 13D). The books refer to hardbacks, paperbacks, and the like (see FIG. 13E). The recording media refer to DVD software, video tapes, and the like (see FIG. 13F). The vehicles refer to wheeled vehicles such as bicycles, ships, and the like (see FIG. 13G). The personal belongings refer to bags, glasses, and the like (see FIG. 13H). The foods refer to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and low-profile TV sets), mobile phones, and the like.

Forgery can be prevented by providing the semiconductor device 2180 for bills, coins, securities, certificates, bearer bonds, or the like. Further, the efficiency of an inspection system, a system used in a rental shop, or the like can be improved by providing the semiconductor device 2180 for packing containers, books, recording media, personal belongings, foods, commodities, electronic devices, or the like. Forgery or theft can be prevented by providing the semiconductor device 2180 for vehicles, health products, medicine, or the like; with regard to medicine, medicine can be prevented from being taken mistakenly. The semiconductor device 2180 can be provided by being attached to a surface of an object or being embedded in an object. For example, in the case of a book, the semiconductor device 2180 may be embedded in the paper; in the case of a package made of an organic resin, the semiconductor device 2180 may be embedded in the organic resin.

As described above, the efficiency of an inspection system, a system used in a rental shop, or the like can be improved by providing the semiconductor device 2180 for packing containers, recording media, personal belongings, foods, clothing, commodities, electronic devices, or the like. Further, by providing the semiconductor device 2180 for vehicles or the like, forgery or theft thereof can be prevented. Furthermore, by implanting the semiconductor device 2180 in a creature such as an animal, an individual creature can be easily identified. For example, by implanting or attaching the semiconductor device with a sensor into a creature such as livestock, its health condition such as a body temperature as well as its birth year, sex, breed, or the like can be easily managed.

This embodiment mode can be freely combined with the preceding embodiment modes.

This application is based on Japanese Patent Application serial No. 2007-127081 filed with Japan Patent office on May 11, 2007, the entire contents of which are hereby incorporated by reference.

What is claimed is:

1. A method for manufacturing a semiconductor device comprising:
    forming an island-like semiconductor film over an insulating substrate;
    forming a gate insulating film over the island-like semiconductor film;
    forming a gate electrode over the gate insulating film;
    forming a pair of impurity regions by introducing an impurity element into the island-like semiconductor film using the gate electrode as a mask;
    forming a first metal film in a region in contact with the pair of impurity regions, and in a region located over the gate electrode and overlapping with the gate electrode;
    forming a second metal film which functions as a reflective film in a region located over the first metal film and overlapping with the gate electrode;
    removing parts of the second metal film to expose parts of the first metal film which is in contact with the pair of impurity regions; and irradiating the exposed parts of the first metal film and the second metal film with laser light to heat the first metal film selectively to selectively cause a reaction between the island-like semiconductor film and the first metal film in the region in contact with the pair of impurity regions.

2. The method for manufacturing a semiconductor device according to claim 1, wherein the laser light is emitted from an excimer laser.

3. The method for manufacturing a semiconductor device according to claim 1, wherein a channel formation region is formed between the pair of impurity regions, the channel formation region having a thickness smaller than a thickness of the pair of impurity regions.

4. The method for manufacturing a semiconductor device according to claim 1, wherein a channel formation region is formed between the pair of impurity regions, the channel formation region having a thickness of 10 to 30 nm.

5. The method for manufacturing a semiconductor device according to claim 1, wherein the first metal film is formed of Ni, Co, Ti, or Pt.

6. The method for manufacturing a semiconductor device according to claim 1, wherein the second metal film which functions as a reflective film is formed of aluminum, an aluminum alloy, silver, or a silver alloy.

7. The method for manufacturing a semiconductor device according to claim 1, wherein the insulating substrate is a glass substrate, a quartz substrate, a sapphire substrate, a ceramic substrate, a metal substrate for which an insulating layer is provided on a surface of the metal substrate.

8. The method for manufacturing a semiconductor device according to claim 1, wherein the impurity element is boron or phosphorus.

9. The method for manufacturing a semiconductor device according to claim 1, wherein the reaction caused between the island-like semiconductor film and the first metal film in the region in contact with the pair of impurity regions forms a silicide film.

10. A method for manufacturing a semiconductor device comprising:
    forming an island-like semiconductor film over an insulating substrate;
    forming a gate insulating film over the island-like semiconductor film;
    forming a gate electrode over the gate insulating film;
    forming a first impurity region and a second impurity region by introducing an impurity element into the island-like semiconductor film using the gate electrode as a mask;
    forming an interlayer insulating film over the gate electrode;
    forming a contact hole to expose at least a portion of each of the first impurity region and the second impurity region by etching the interlayer insulating film and the gate insulating film;
    forming a first metal film over the interlayer insulating film, and in a region in contact with the first impurity region and the second impurity region;
    forming a second metal film which functions as a reflective film over the first metal film;
    removing the second metal film located over the first impurity region and the second impurity region; and
    irradiating the exposed first metal film and the second metal film with laser light to heat the first metal film selectively to selectively cause a reaction between the island-like semiconductor film and the first metal film in the region in contact with the first impurity region and the second impurity region.

11. The method for manufacturing a semiconductor device according to claim 10, wherein the laser light is emitted from an excimer laser.

12. The method for manufacturing a semiconductor device according to claim 10, wherein a channel formation region is formed between the first impurity region and the second impurity region, the channel formation region having a thickness smaller than a thickness of the first impurity region and the second impurity region.

13. The method for manufacturing a semiconductor device according to claim 10, wherein a channel formation region is formed between the first impurity region and the second impurity region, the channel formation region having a thickness of 10 to 30 nm.

14. The method for manufacturing a semiconductor device according to claim 10, wherein the first metal film is formed of Ni, Co, Ti, or Pt.

15. The method for manufacturing a semiconductor device according to claim 10, wherein the second metal film which functions as a reflective film is formed of aluminum, an aluminum alloy, silver, or a silver alloy.

16. The method for manufacturing a semiconductor device according to claim 10, wherein the insulating substrate is a glass substrate, a quartz substrate, a sapphire substrate, a ceramic substrate, a metal substrate for which an insulating layer is provided on a surface of the metal substrate.

17. The method for manufacturing a semiconductor device according to claim 10, wherein the impurity element is boron or phosphorus.

18. The method for manufacturing a semiconductor device according to claim 10, wherein the reaction caused between the island-like semiconductor film and the first metal film in the region in contact with the first impurity region and the second impurity region forms a silicide film.

* * * * *